(12) United States Patent
Lin et al.

(10) Patent No.: US 11,362,633 B2
(45) Date of Patent: Jun. 14, 2022

(54) ACOUSTIC WAVE DEVICE AND FABRICATION METHOD THEREOF

(71) Applicant: WUHAN YANXI MICRO COMPONENTS CO., LTD., Hubei (CN)

(72) Inventors: Re-Ching Lin, Wuhan (CN); Pei-Chun Liao, Wuhan (CN)

(73) Assignee: WUHAN YANXI MICRO COMPONENTS CO., LTD., Hubei (CN)

( * ) Notice: Subject to any disclaimer, the term of this patent is extended or adjusted under 35 U.S.C. 154(b) by 270 days.

(21) Appl. No.: 16/627,290

(22) PCT Filed: Jun. 27, 2019

(86) PCT No.: PCT/CN2019/093405
§ 371 (c)(1),
(2) Date: Dec. 28, 2019

(87) PCT Pub. No.: WO2020/087957
PCT Pub. Date: May 7, 2020

(65) Prior Publication Data
US 2021/0359658 A1      Nov. 18, 2021

(30) Foreign Application Priority Data

Oct. 31, 2018 (CN) .......................... 201811291555.0

(51) Int. Cl.
*H03H 3/04* (2006.01)
*H03H 9/13* (2006.01)
(Continued)

(52) U.S. Cl.
CPC .............. *H03H 3/04* (2013.01); *H03H 9/105* (2013.01); *H03H 9/131* (2013.01); *H03H 2003/021* (2013.01)

(58) Field of Classification Search
CPC .... H03H 3/04; H03H 9/131; H03H 2003/021; H03H 9/1014; H03H 9/1042;
(Continued)

(56) References Cited

U.S. PATENT DOCUMENTS

| 8,114,635 B2 | 2/2012 | Klotz |
| 8,227,958 B2 | 7/2012 | Inoue |

(Continued)

FOREIGN PATENT DOCUMENTS

| CN | 1517295 A | 8/2004 |
| CN | 101635562 A | 1/2010 |

(Continued)

OTHER PUBLICATIONS

International Search Report in the international application No. PCT/CN2019/093405, dated Aug. 30, 2019.
(Continued)

*Primary Examiner* — Rakesh B Patel
*Assistant Examiner* — Jorge L Salazar, Jr.
(74) *Attorney, Agent, or Firm* — Syncoda LLC; Feng Ma

(57) ABSTRACT

An acoustic wave device includes a substrate, as well as a first electrode layer, a piezoelectric layer and a second electrode layer which are sequentially arranged on the substrate. The device further includes a protective layer. The protective layer is at least arranged at a first position above the surface, far away from the substrate, of the second electrode layer. The first position is a position, corresponding to a first overlapping region, above the second electrode layer. The first overlapping region, where an active area of the acoustic wave device is located, is at least a part of a region where the first electrode layer, the second electrode layer and the piezoelectric layer are overlapped. A fabrication method for an acoustic wave device is also provided.

8 Claims, 12 Drawing Sheets

(51) Int. Cl.
*H03H 9/10* (2006.01)
*H03H 3/02* (2006.01)

(58) Field of Classification Search
CPC .................. H03H 9/105; H03H 9/173; H03H 2003/0414; H03H 3/02; H03H 9/15; H03H 9/171; H03H 9/54
USPC ........................................ 333/133, 187, 188
See application file for complete search history.

(56) References Cited

U.S. PATENT DOCUMENTS

| | | | |
|---|---|---|---|
| 8,448,312 | B2 | 5/2013 | Tange |
| 8,629,036 | B2 | 1/2014 | Luce |
| 8,921,201 | B2 | 12/2014 | Luce et al. |
| 2002/0109565 | A1 | 8/2002 | Ella |
| 2004/0140865 | A1 | 7/2004 | Komuro et al. |
| 2005/0140247 | A1 | 6/2005 | Lee |
| 2007/0024395 | A1 | 2/2007 | Motai |
| 2007/0044296 | A1 | 3/2007 | Jeon |
| 2007/0057599 | A1 | 3/2007 | Motai et al. |
| 2010/0201221 | A1 | 8/2010 | Inoue |
| 2012/0013415 | A1 | 1/2012 | Tange |
| 2013/0119491 | A1 | 5/2013 | Luce |
| 2014/0091407 | A1 | 4/2014 | Luce et al. |
| 2016/0329878 | A1 | 11/2016 | Ochiai et al. |
| 2020/0007111 | A1* | 1/2020 | Stokes .................. H01L 23/315 |

FOREIGN PATENT DOCUMENTS

| | | |
|---|---|---|
| CN | 102340287 A | 2/2012 |
| CN | 103283146 A | 9/2013 |
| CN | 103930979 A | 7/2014 |
| CN | 107181469 A | 9/2017 |
| CN | 109474254 A | 3/2019 |
| JP | 2004017171 A | 1/2004 |
| JP | 2005094728 A | 4/2005 |
| JP | 2005198233 A | 7/2005 |
| JP | 2006101005 A | 4/2006 |
| JP | 2006211296 A | 8/2006 |
| JP | 2006326806 A | 12/2006 |
| JP | 2008011141 A | 1/2008 |
| JP | 2009038518 A | 2/2009 |
| JP | 2010154233 A | 7/2010 |
| JP | 2015502074 A | 1/2015 |
| JP | 2016039516 A | 3/2016 |
| KR | 20070023352 A | 2/2007 |
| WO | 2012127979 A1 | 9/2012 |

OTHER PUBLICATIONS

Supplementary European Search Report in the European application No. 19816487.3, dated Nov. 23, 2020.
English translation of the Written Opinion of the International Search Authority in the international application No. PCT/CN2019/093405, dated Aug. 30, 2019.

* cited by examiner

ACOUSTIC WAVE DEVICE AND FABRICATION METHOD THEREOF

CROSS-REFERENCE TO RELATED APPLICATIONS

The present application is a national stage of International Application No. PCT/CN2019/093405 filed on Jun. 27, 2019, which claims priority to Chinese Patent Application No. 201811291555.0, filed on Oct. 31, 2018. The disclosures of these applications are hereby incorporated by reference in their entirety.

TECHNICAL FIELD

The disclosure relates to an acoustic wave device in the field of semiconductors, and more particularly to an acoustic wave device and a fabrication method thereof.

BACKGROUND

In recent years, communication devices such as mobile phones have been used widely. Acoustic wave devices using acoustic waves are used as filters of communication devices, duplexers and the like. Examples of acoustic wave devices include devices using Surface Acoustic Waves (SAWs), devices using Bulk Acoustic Waves (BAWs) and the like. Piezoelectric thin film resonators are devices using BAWs, and include Film Bulk Acoustic Resonators (FBARs), Solidly Mounted Resonators (SMRs) and the like. An FBAR is a core device of a BAW filter, and its performance determines the performance of the BAW filter.

However, in a fabrication process of an acoustic wave device, processes of fabrication of a bump, thinning of a substrate, cutting of the acoustic wave device and the like may affect an "air bridge" structure formed at a resonance region of the acoustic wave device and further affect the resonance region, resulting in damage to the performance of the acoustic wave device.

SUMMARY

In order to solve the above technical problem, embodiments of the disclosure are intended to provide an acoustic wave device and a fabrication method thereof.

The embodiments of the disclosure provide an acoustic wave device, which may include a substrate, as well as a first electrode layer, a piezoelectric layer and a second electrode layer which are sequentially arranged on the substrate. The device further includes a protective layer.

The protective layer may at least be arranged at a first position above the surface, far away from the substrate, of the second electrode layer.

The first position may be a position, corresponding to a first overlapping region, above the second electrode layer. The first overlapping region, where an active area of the acoustic wave device is located, is at least a part of a region where the first electrode layer, the second electrode layer and the piezoelectric layer are overlapped.

In an optional embodiment of the disclosure, the device may further include a conductive layer arranged on the surface, far away from the substrate, of the first electrode layer and the surface, far away from the substrate, of the second electrode layer.

The protective layer may be arranged at a position such that the protective layer does not cover the conductive layer.

In an optional embodiment of the disclosure, a region between the protective layer and a portion, corresponding to the first overlapping region, of the second electrode layer may be hollow.

In an optional embodiment of the disclosure, the protective layer may include a first protective sublayer and a second protective sublayer.

The first protective sublayer may be arranged at a position on a surface of an outermost layer far away from the substrate of the acoustic wave device, such that the first protective sublayer does not cover the conductive layer.

The second protective sublayer may be arranged at the first position above the surface, far away from the substrate, of the second electrode layer.

The second protective sublayer may also be arranged on the surface, far away from the substrate, of the first protective sublayer.

The first protective sublayer and the second protective sublayer may be connected together.

In an optional embodiment of the disclosure, a region between the second protective sublayer and the second electrode layer may be hollow.

In an optional embodiment of the disclosure, a position of the first protective sublayer may be at a preset distance from a position of the first overlapping region.

In an optional embodiment of the disclosure, the device may further include a first through hole passing through the second electrode layer, the piezoelectric layer and the first electrode layer and a second through hole passing through the second protective sublayer. The second through hole may be communicated with the first through hole.

In an optional embodiment of the disclosure, the preset distance may be longer than 0.001 um.

In an optional embodiment of the disclosure, a thickness of the first protective sublayer may range from 0.001 um to 200 um.

A thickness of the second protective sublayer may range from 1 um to 200 um.

The embodiments of the disclosure also provide a fabrication method for an acoustic wave device, which may include the following operations.

A substrate is formed. A first electrode layer, a piezoelectric layer and a second electrode layer are sequentially formed on the substrate.

A protective layer is formed. The protective layer is at least formed at a first position above the surface, far away from the substrate, of the second electrode layer.

The first position may be a position, corresponding to a first overlapping region, above the second electrode layer. The first overlapping region, where an active area of the acoustic wave device is located, may be at least a part of a region where the first electrode layer, the second electrode layer and the piezoelectric layer are overlapped.

In an embodiment of the disclosure, the method may further include the following operation.

A conductive layer is formed on the surface, far away from the substrate, of the first electrode layer and the surface, far away from the substrate, of the second electrode layer.

The protective layer may be formed at a position such that the protective layer does not cover the conductive layer.

In an optional embodiment of the disclosure, the protective layer may include a first protective sublayer and a second protective sublayer. The formation of the protective layer may include the following operations.

The first protective sublayer is formed at a position on a surface of an outermost layer far away from the substrate of the acoustic wave device, such that the first protective sublayer does not cover the conductive layer.

The second protective sublayer is formed at the first position above the surface, far away from the substrate, of the second electrode layer and on the surface, far away from the substrate, of the first protective sublayer.

The first protective sublayer and the second protective sublayer may be connected together.

In an optional embodiment of the disclosure, the formation of the substrate and the sequential formation of the first electrode layer, the piezoelectric layer and the second electrode layer on the substrate may include the following operation.

The substrate is formed. A sacrificial layer, the first electrode layer, the piezoelectric layer and the second electrode layer are sequentially formed on the substrate.

In an optional embodiment of the disclosure, after the formation of the substrate and the sequential formation of the sacrificial layer, the first electrode layer, the piezoelectric layer and the second electrode layer on the substrate, the method may further include the following operation.

A first through hole passing through the second electrode layer, the piezoelectric layer and the first electrode layer is formed.

Correspondingly, after the formation of the second protective sublayer, the method may further include the following operations.

A second through hole passing through the second protective sublayer and communicated with the first through hole is formed.

The sacrificial layer between the first electrode layer and the substrate is removed through the second through hole and the first through hole.

In an optional embodiment of the disclosure, after the formation of the substrate and the sequential formation of the sacrificial layer, the first electrode layer, the piezoelectric layer and the second electrode layer on the substrate, the method may further include the following operation.

The first through hole passing through the second electrode layer, the piezoelectric layer and the first electrode layer is formed.

Correspondingly, before the formation of the second protective sublayer, the method may further include the following operation.

The sacrificial layer between the first electrode layer and the substrate is removed through the first through hole.

In an optional embodiment of the disclosure, after the removal of the sacrificial layer between the first electrode layer and the substrate through the first through hole, the method may further include the following operations.

A first frequency of the acoustic wave device is measured.

The first frequency is adjusted to a second frequency on the basis of a preset frequency. The second frequency is matched with the preset frequency.

According to the acoustic wave device and fabrication method thereof provided in the embodiments of the disclosure, the acoustic wave device includes the substrate, as well as the first electrode layer, piezoelectric layer and second electrode layer which are sequentially arranged on the substrate. The acoustic wave device further includes the protective layer at least arranged at the first position above the surface, far away from the substrate, of the second electrode layer. The first position is a position, corresponding to the first overlapping region, on the second electrode layer. The first overlapping region, where the active area of the acoustic wave device is located, is at least a part of a region where the first electrode layer, the second electrode layer and the piezoelectric layer are overlapped. In such a manner, the protective layer arranged at the first position above the surface, far away from the substrate, of the second electrode layer of the acoustic wave device may shelter and protect an "air bridge" structure formed at a resonance region of the acoustic wave device. In this way, the problem of influence of a fabrication process on the "air bridge" structure in the acoustic wave device during fabrication of the acoustic wave device is solved, and influence on the resonance region of the acoustic wave device is avoided, thereby improving the performance of the acoustic wave device.

Figure 1:
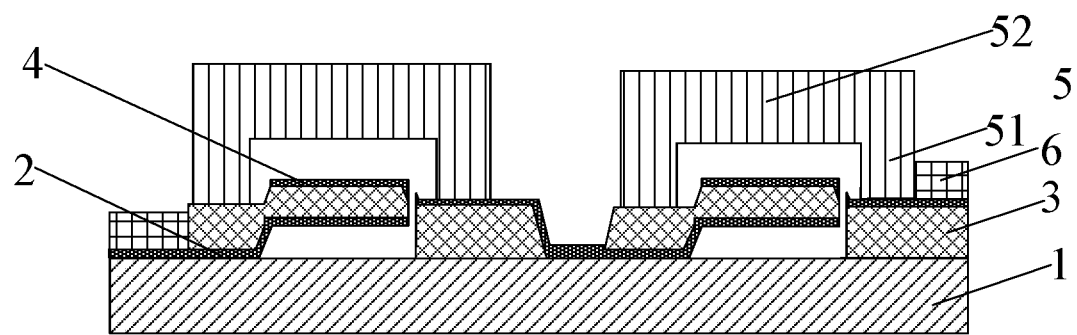
FIG. 1 is a structure diagram of an acoustic wave device according to an embodiment of the disclosure.

1—substrate, 2—first electrode layer, 3—piezoelectric layer, 4—second electrode layer, 5—protective layer, 51—first protective sublayer, 52—second protective sublayer, 6—conductive layer, 7—first through hole, 8—second through hole, and 9—sacrificial layer.

DETAILED DESCRIPTION

The technical solutions in the embodiments of the disclosure will be clearly and completely described below in combination with the drawings in the embodiments of the disclosure.

An embodiment of the disclosure provides an acoustic wave device, which may include a substrate 1, as well as a first electrode layer 2, a piezoelectric layer 3 and a second electrode layer 4 which are sequentially arranged on the substrate 1. The device further includes a protective layer 5.

The protective layer 5 is at least arranged at a first position above the surface, far away from the substrate 1, of the second electrode layer 4.

The first position is a position, corresponding to a first overlapping region, above the second electrode layer 4, and the first overlapping region, where an active area of the acoustic wave device is located, is at least a part of a region where the first electrode layer 2, the second electrode layer 4 and the piezoelectric layer 3 are overlapped.

It is to be noted that, in the structure of the acoustic wave device in the embodiment, the protective layer 5 is only exemplarily at least arranged at the first position above the surface, far away from the substrate 1, of the second electrode layer 4, and the protective layer is not limited to only be arranged at this position. In addition, in the embodiment, the protective layer 5 does not contact with the second electrode layer 4 at an "air bridge" structure formed in the acoustic wave device.

The first overlapping region may refer to the region where the active area of the acoustic wave device is located, which is at least a part of region where the second electrode layer 4, the piezoelectric layer 3 and the first electrode layer 2 are sequentially arranged along a direction of getting close to the substrate 1 in the acoustic wave device. It can be understood that the direction of getting close to the substrate 1 in the embodiment of the disclosure specifically refer to a direction from a position relatively far away from the substrate to a position relatively close to the substrate 1, for example, corresponding to a direction from top to bottom in FIG. 1 (the substrate is at the bottom in FIG. 1).

In a specific embodiment, there is a hollow region between an upper surface of the substrate 1 and a lower surface of the first electrode layer 2. It can be understood that an overlapping portion at which the second electrode layer 4, the piezoelectric layer 3 and the first electrode layer 2 are overlapped and which is located above the hollow region may form the "air bridge" structure of the acoustic wave device. A region where the "air bridge" structure is located is the active area of the acoustic wave device. In the embodiment of the disclosure, a main purpose of arranging the protective layer is to shelter and protect the "air bridge" structure formed at a resonance region of the acoustic wave device. Therefore, the protective layer is at least arranged above the active region.

In another embodiment of the disclosure, the acoustic wave device may further include a conductive layer 6 arranged on the surface, far away from the substrate 1, of the first electrode layer and the surface, far away from the substrate 1, of the second electrode layer 4.

The protective layer 5 is arranged at a position such that the conductive layer 6 is not covered.

It is to be noted that the protective layer in the embodiment of the disclosure does not cover the conductive layer such that a frequency of the acoustic wave device may be subsequently measured and calibrated through the conductive layer.

In another embodiment of the disclosure, a region between the protective layer 5 and a portion, corresponding to the first overlapping region, of the second electrode layer 4 is hollow.

That is, in the embodiment of the disclosure, the protective layer does not directly contact with the second electrode layer at the "air bridge" structure formed in the acoustic wave device, so that influence of the protective layer on the frequency of the acoustic wave device may be avoided.

According to the acoustic wave device provided in the embodiment of the disclosure, the acoustic wave device includes the substrate, as well as the first electrode layer, piezoelectric layer and second electrode layer which are sequentially arranged on the substrate. The acoustic wave device further includes the protective layer at least arranged at the first position above the surface, far away from the substrate, of the second electrode layer. The first position is a position, corresponding to the first overlapping region, above the second electrode layer. The first overlapping region is at least a part of the region where the first electrode layer, the second electrode layer and the piezoelectric layer are overlapped. In such a manner, the protective layer arranged at the first position above the surface, far away from the substrate, of the second electrode layer of the acoustic wave device, may shelter and protect an "air bridge" structure formed at a resonance region of the acoustic wave device, so that the problem of influence of a fabrication process on the "air bridge" structure in the acoustic wave device during fabrication of the acoustic wave device is solved, and influence on the resonance region of the acoustic wave device is avoided, thereby improving the performance of the acoustic wave device.

Based on the abovementioned embodiment, an embodiment of the disclosure provides an acoustic wave device. Referring to FIG. 1, the acoustic wave device includes a substrate 1, a first electrode layer 2, piezoelectric layer 3 and second electrode layer 4 which are sequentially arranged on the substrate 1, and a conductive layer 6 arranged on the surface, far away from the substrate 1, of the first electrode layer 2 and the surface, far away from the substrate 1, of the second electrode layer 4. The acoustic wave device further includes a protective layer 5.

The protective layer 5 includes a first protective sublayer 51 and a second protective sublayer 52.

The first protective sublayer 51 is arranged at a position on a surface of an outermost layer far away from the substrate 1 of the acoustic wave device, such that the first protective sublayer 51 does not cover the conductive layer 6.

The second protective sublayer 52 is arranged at a first position above the surface, far away from the substrate 1, of the second electrode layer 4.

The first position is a position, corresponding to a first overlapping region, above the second electrode layer 4. The first overlapping region, where an active area of the acoustic wave device is located, is at least a part of a region where the first electrode layer 2, the second electrode layer 4 and the piezoelectric layer 3 are overlapped.

Herein, the outermost layer far away from the substrate 1 of the acoustic wave device refers to an outermost layer of the structure of the device when the protective layer 5 is arranged. For example, when a specific process is performed, the first protective sublayer 51 is arranged on a surface of an exposed upper layer of the structure of the device. It can be understood that, although the protective layer 5 is at least arranged at the first position (in a specific embodiment, a region between the first position and the second electrode layer 4 is hollow), the protective layer 5 should also be integrally connected with other structures in the acoustic wave device, for example, connected with the outermost layer of the structure of the device, and meanwhile, provided that the protective layer 5 does not cover an outer surface (upper surface in the figure) of the conductive layer 6.

In another embodiment of the disclosure, the first protective sublayer 51 may be arranged at a position in and around the first overlapping region such that the first protective sublayer 51 does not cover the conductive layer 6. FIG. 1 illustrates that the first protective sublayer 51 is arranged at a second position on the surface, far away from the substrate 1, of the second electrode layer 4 and a position on the surface, far away from the substrate 1, of the piezoelectric layer 3, such that the first protective sublayer 51 does not cover the conductive layer 6. The second position is a position, corresponding to a second overlapping region, on the second electrode layer 4, and the first protective sublayer 51 arranged thereon does not cover the conductive layer 6. The second overlapping region is at least a part of a region where the second electrode layer 4 and the piezoelectric layer 3 are overlapped.

It is to be noted that the first position, the second position, the first overlapping region and the second overlapping region in the embodiment are consistent with those in the abovementioned embodiment. Therefore, explanations to the first position, the second position, the first overlapping region and the second overlapping region may refer to descriptions in the abovementioned embodiment and elaborations are omitted herein.

The second protective sublayer 52 is also arranged on the surface, far away from the substrate 1, of the first protective sublayer 51.

The first protective sublayer 51 and the second protective sublayer 52 are connected together.

In another embodiment of the disclosure, a region between the second protective sublayer 52 and the second electrode layer 4 is hollow.

It is to be noted that, in the embodiment, as shown in FIG. 1, the first protective sublayer and the second protective sublayer may form a structure such that the second protective sublayer is arranged across the first protective sublayer. In addition, the first protective sublayer, the second protective sublayer and a portion of a layer contacting with the first protective sublayer may form a hollow structure shown in FIG. 1. Moreover, the hollow region between the second protective sublayer and the second electrode layer may ensure that the second protective sublayer does not contact with the second electrode layer at an "air bridge" structure formed in the acoustic wave device, avoiding influence of the second protective layer on a frequency of the acoustic wave device and inaccuracy of the frequency of the finally formed acoustic wave device.

Materials for the first protective sublayer and the second protective sublayer may be same or different. Moreover, the material for the first protective sublayer may include a metal, ceramic and organics etc. The material for the second protective sublayer may include a metal, ceramic and organics etc. Of course, in a possible embodiment, the materials for the first protective sublayer and the second protective sublayer may be a photosensitive dry film photoresist.

A thickness of the first protective sublayer ranges from 0.001 um to 200 um.

A thickness of the second protective sublayer ranges from 1 um to 200 um.

Herein, the thickness of the first protective sublayer and the thickness of the second protective sublayer may refer to heights of the first protective sublayer and the second protective layer formed on the surface of the structure of the device respectively.

It is to be noted that the thickness ranging from 0.001 um to 200 um of the first protective sublayer and the thickness ranging from 1 um to 200 um of the second protective sublayer may ensure that the protective layer is thick enough to protect the formed "air bridge" structure and also avoid an over thickness of the finally formed acoustic wave device, thereby avoid an oversize of the finally formed acoustic wave device.

In another embodiment of the disclosure, the position of the first protective sublayer 51 is at a preset distance from a position of the first overlapping region.

Herein, the preset distance is a distance along a transverse direction of the acoustic wave device, i.e., along a direction parallel to the substrate.

The preset distance may be longer than 0.001 um.

It is to be noted that the distance between the position of the first protective sublayer and the position of the first overlapping region being longer than 0.001 um may avoid influence on a frequency of the acoustic wave device.

Figure 2:
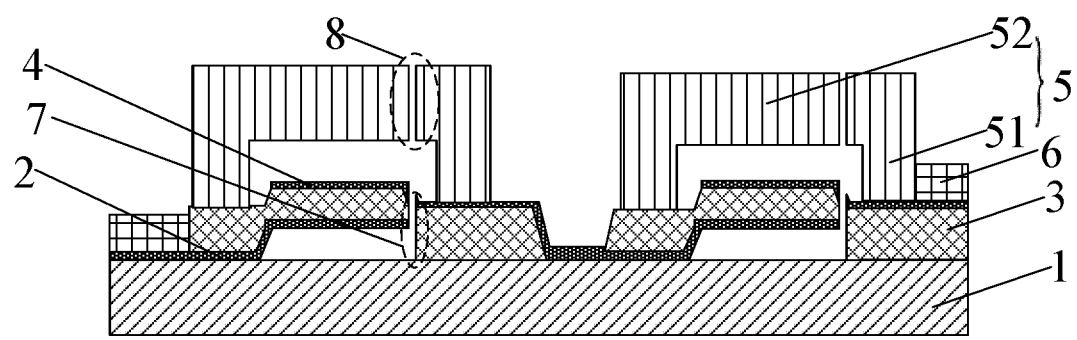
FIG. 2 is a structure diagram of an acoustic wave device according to another embodiment of the disclosure.

In another embodiment of the disclosure, as shown in FIG. 2, the acoustic wave device further includes a first through hole 7 passing through the second electrode layer 4, the piezoelectric layer 3 and the first electrode layer 2 and a second through hole 8 passing through the second protective sublayer 52. The second through hole 8 is communicated with the first through hole 7.

As shown in the figure, the first through hole 7 passes through the piezoelectric layer 3, the first electrode layer 2 and the second electrode layer 4 and reaches up to the substrate 1. The first through hole 7 is formed in the second electrode layer 4. The second through hole 8 is formed in the second protective sublayer 52.

In another embodiment of the disclosure, a characteristic size of the second through hole may range from 0.01 um to 100 um.

After the second through hole is communicated with the first through hole, a sacrificial layer between the first electrode layer and the substrate may be removed through the first through hole and the second through hole. The sacrificial layer before being removed contacts with the first electrode layer, so that a region between the first electrode layer and the substrate is hollow after the sacrificial layer is removed. In this way, influence of the sacrificial layer on the frequency of the acoustic wave device may be avoided.

It is to be noted that the protective layer in the acoustic wave device in the embodiment of the disclosure has a function of protecting and stabilizing the "air bridge" structure in the acoustic wave device. In this way, although a thickness of the "air bridge" structure is only several microns during processes of fabrication of a bump, thinning of the substrate, cutting of the acoustic wave device and the like with respect to the acoustic wave device, the presence of the protective layer makes the "air bridge" structure more stable, avoiding influence on the "air bridge" structure and damage to performance of the acoustic wave device.

According to the acoustic wave device provided in the embodiment of the disclosure, the protective layer arranged at the first position above the surface, far away from the substrate, of the second electrode layer of the acoustic wave device may shelter and protect the "air bridge" structure formed at a resonance region of the acoustic wave device, so that the problem of influence of a fabrication process on the "air bridge" structure in the acoustic wave device during fabrication of the acoustic wave device is solved, and influence on the resonance region of the acoustic wave device is avoided, thereby improving the performance of the acoustic wave device.

Figure 3:
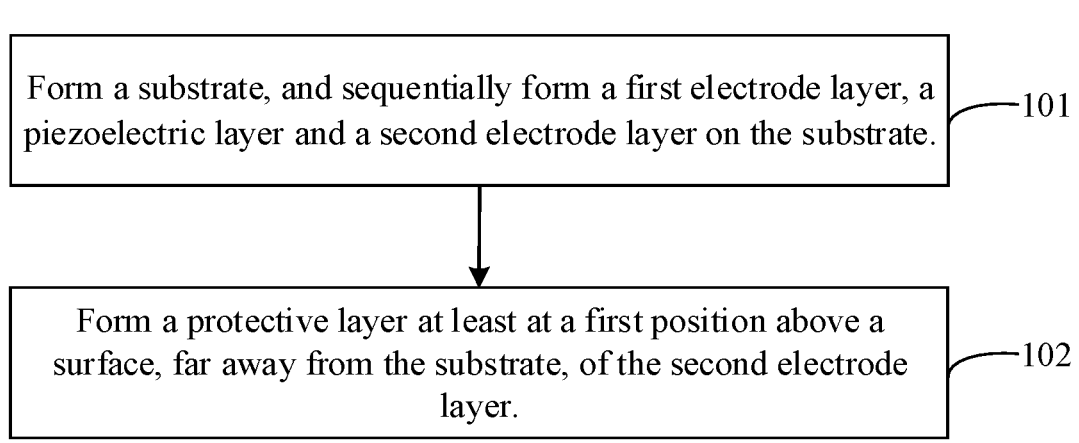
FIG. 3 is a flowchart of a fabrication method for an acoustic wave device according to an embodiment of the disclosure.

Based on the abovementioned embodiments, an embodiment of the disclosure provides a fabrication method for an acoustic wave device. Referring to FIG. 3, the method includes the following steps.

In 101, a substrate is formed, and a first electrode layer, a piezoelectric layer and a second electrode layer are sequentially formed on the substrate.

There are no specific limits made to a process of forming the substrate and the first electrode layer, piezoelectric layer and second electrode layer on the substrate in the embodiment and all materials and processes capable of realizing a function of a conductive layer in a related art are feasible.

In 102, a protective layer is formed, and the protective layer is at least formed at a first position above the surface, far away from the substrate, of the second electrode layer.

The first position is a position, corresponding to a first overlapping region, above the second electrode layer, and the first overlapping region, where an active area of the acoustic wave device is located, is at least a part of a region where the first electrode layer, the second electrode layer and the piezoelectric layer are overlapped.

It is to be noted that, the protective layer may be formed by a coating or adhesion process. If a material for the protective layer is a dry film photoresist, the protective layer may be formed by the adhesion process, in which the dry film photoresist is adhered to the first position above the surface, far away from the substrate, of the second electrode layer.

According to the fabrication method for the acoustic wave device in the embodiment of the disclosure, when the acoustic wave device is being fabricated, the protective layer is formed at the first position above the surface, far away from the substrate, of the second electrode layer of the acoustic wave device. The protective layer may shelter and protect an "air bridge" structure formed at a resonance region of the acoustic wave device. In this way, the problem of influence of a fabrication process on the "air bridge" structure in the acoustic wave device during fabrication of the acoustic wave device is solved, and influence on the resonance region of the acoustic wave device is avoided, thereby improving the performance of the acoustic wave device.

Figure 4:
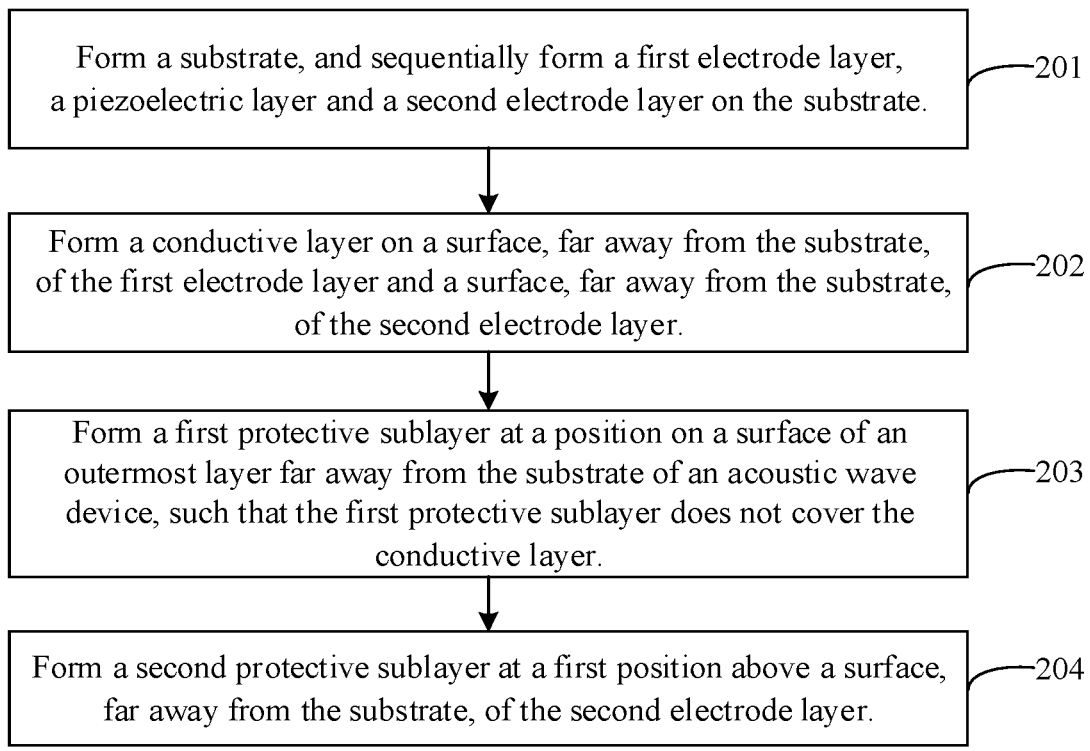
FIG. 4 is a flowchart of a fabrication method for an acoustic wave device according to another embodiment of the disclosure.

Based on the abovementioned embodiments, an embodiment of the disclosure provides a fabrication method for an acoustic wave device. Referring to FIG. 4, the method includes the following steps.

In 201, a substrate is formed, and a first electrode layer, a piezoelectric layer and a second electrode layer are sequentially formed on the substrate.

In 202, a conductive layer is formed on the surface, far away from the substrate, of the first electrode layer, and the surface, far away from the substrate, of the second electrode layer.

There are no specific limits made to a process of forming the conductive layer and a material for the conductive layer in the embodiment. All materials and processes capable of realizing a function of the conductive layer in the related art are feasible.

In 203, a first protective sublayer is formed at a position on a surface of an outermost layer far away from the substrate of the acoustic wave device, such that the first protective sublayer does not cover the conductive layer.

In 204, a second protective sublayer is formed at a first position above the surface, far away from the substrate, of the second electrode layer.

The first position is a position, corresponding to a first overlapping region, above the second electrode layer. The first overlapping region, where an active area of the acoustic wave device is located, is at least a part of a region where the first electrode layer, the second electrode layer and the piezoelectric layer are overlapped. It is to be noted that explanations, in the embodiment, to the same or corresponding steps and concepts in other embodiments may refer to descriptions in the other embodiments and elaborations are omitted herein.

According to the fabrication method for the acoustic wave device in the embodiment of the disclosure, when the acoustic wave device is being fabricated, a protective layer is formed at the first position above the surface, far away from the substrate, of the second electrode layer of the acoustic wave device. The protective layer may shelter and protect an "air bridge" structure formed at a resonance region of the acoustic wave device. In this way, the problem of influence of a fabrication process on the "air bridge" structure in the acoustic wave device during fabrication of the acoustic wave device is solved, and influence on the resonance region of the acoustic wave device is avoided, thereby improving the performance of the acoustic wave device.

Figure 5:
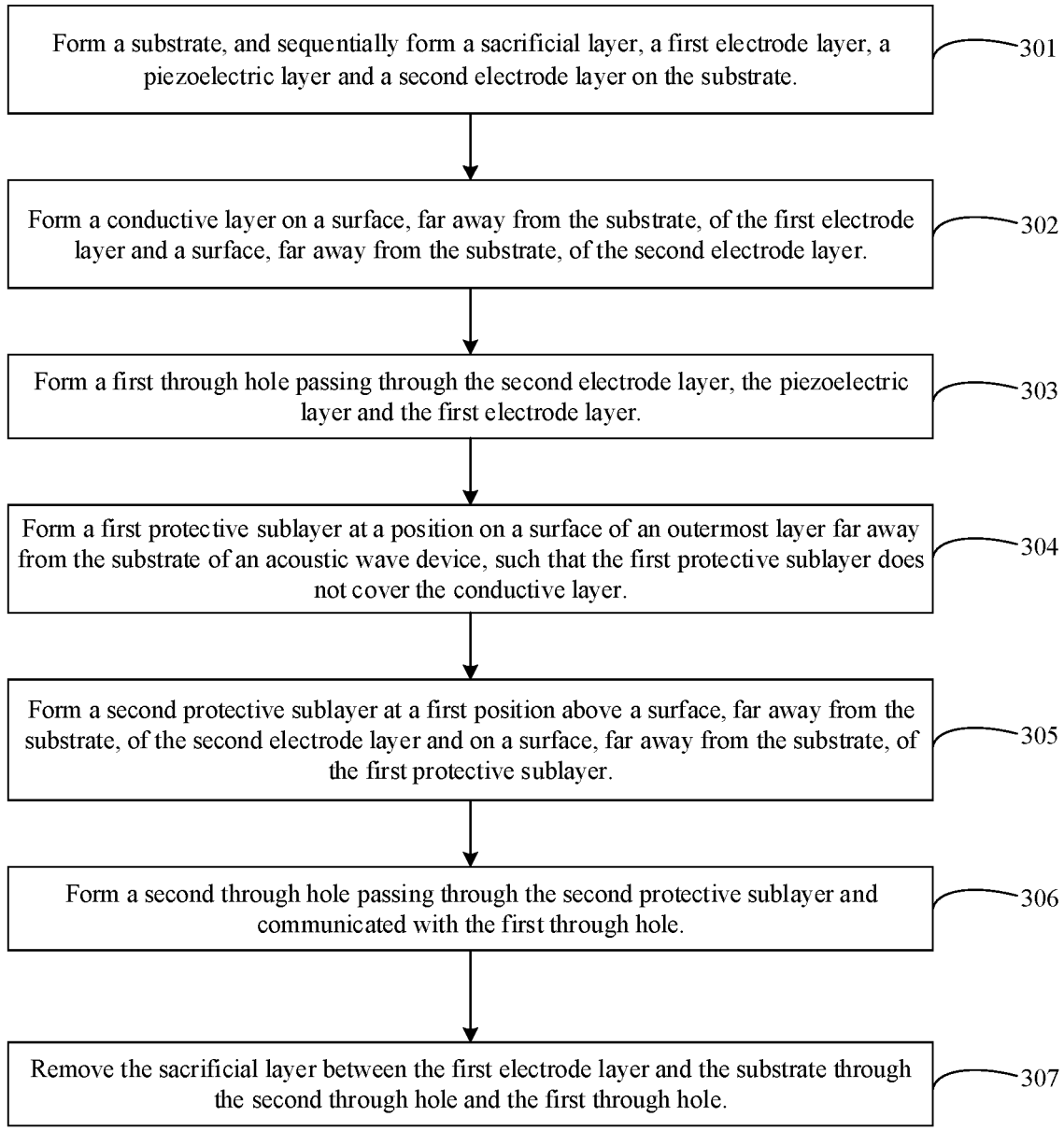
FIG. 5 is a flowchart of a fabrication method for an acoustic wave device according to a further embodiment of the disclosure.

Based on the abovementioned embodiments, an embodiment of the disclosure provides a fabrication method for an acoustic wave device. Referring to FIG. 5, the method includes the following steps.

In 301, a substrate is formed, and a sacrificial layer, a first electrode layer, a piezoelectric layer and a second electrode layer are sequentially formed on the substrate.

In 302, a conductive layer is formed on the surface, far away from the substrate, of the first electrode layer and the surface, far away from the substrate, of the second electrode layer.

In 303, a first through hole passing through the second electrode layer, the piezoelectric layer and the first electrode layer is formed.

The first through hole may be formed by an etching process. Of course, there are no specific limits made to a process of forming the first through hole in the embodiment and all implementation processes in the related art are feasible.

In 304, a first protective sublayer is formed at a position on a surface of an outermost layer far away from the substrate of the acoustic wave device, such that the first protective sublayer does not cover the conductive layer.

The first protective sublayer may be arranged at a position in and around a first overlapping region such that the first protective sublayer does not cover the conductive layer. In a possible embodiment, the first protective sublayer may be arranged at a second position on the surface, far away from the substrate, of the second electrode layer and a position on the surface, far away from the substrate, of the piezoelectric layer, such that the first protective sublayer does not cover the conductive layer. The second position is a position, corresponding to a second overlapping region, on the second electrode layer, and the first protective sublayer arranged thereon does not cover the conductive layer. The second overlapping region is at least a part of a region where the second electrode layer and the piezoelectric layer are overlapped.

The first protective sublayer may be obtained by coating or adhering a material such as a metal, ceramic and organics to the second position on the surface, far away from the substrate, of the second electrode layer and the surface, far away from the substrate, of the piezoelectric layer. In a possible embodiment, if a material for the first protective sublayer is a dry film photoresist material, the first protective sublayer may be formed by adhering a layer of dry film photoresist material with a thickness of 0.001 um-200 um to the second position on the surface, far away from the substrate, of the second electrode layer through an adhesion process and then removing the dry film photoresist material adhered to other positions by etching. After the first protective sublayer is formed, a structure shown in FIG. 6 may be obtained. At this time, the sacrificial layer 9 in the structure is still present.

In 305, a second protective sublayer is formed at a first position above the surface, far away from the substrate, of the second electrode layer and on the surface, far away from the substrate, of the first protective sublayer.

The first position is a position, corresponding to the first overlapping region, above the second electrode layer. The first overlapping region, where an active area of the acoustic wave device is located, is at least a part of a region where the first electrode layer, the second electrode layer and the piezoelectric layer are overlapped.

The first protective sublayer and the second protective sublayer are connected together.

Figure 7:
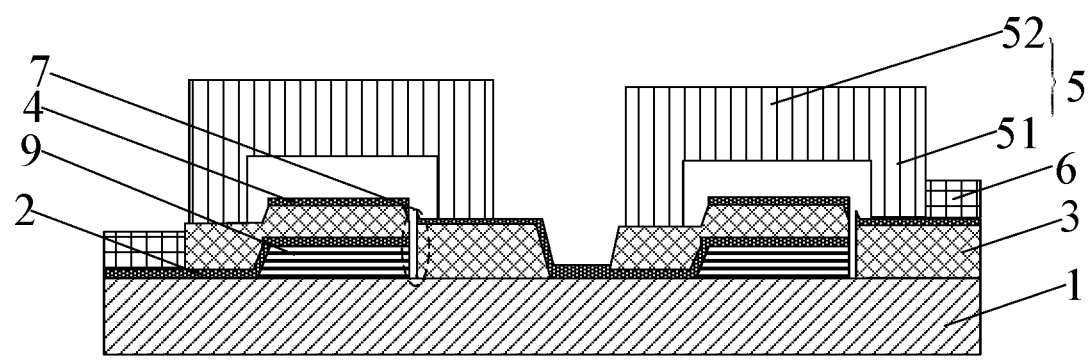
FIG. 7 is a structure diagram during a fabrication process of an acoustic wave device according to another embodiment of the disclosure.

The second protective sublayer may be obtained by adhering a material such as a metal, ceramic and organics to the first position above the surface, far away from the substrate, of the second electrode layer and to the surface, far away from the substrate, of the first protective sublayer. In a possible embodiment, if a material for the second protective sublayer is a dry film photoresist material, the second protective sublayer may be formed by adhering a layer of dry film photoresist material to the surface, far away from the substrate, of the first protective sublayer through the adhesion process and then removing the dry film photoresist material at other positions than a desired position by exposure and development processes, thereby obtaining a structure shown in FIG. 7. At this time, the sacrificial layer 9 in the structure is still present.

In 306, a second through hole passing through the second protective sublayer and communicated with the first through hole is formed, namely the second through hole communicated with the first through hole is formed in the second protective sublayer.

Figure 8:
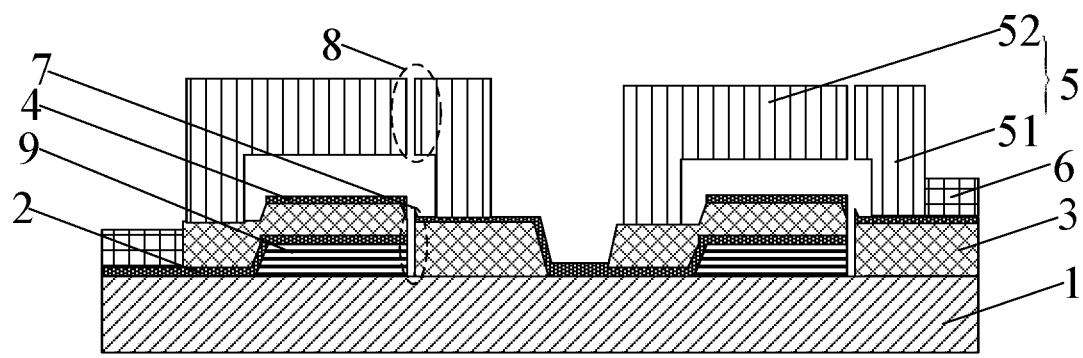
FIG. 8 is a structure diagram during a fabrication process of an acoustic wave device according to a further embodiment of the disclosure.

The second through hole is formed in the second protective sublayer by photolithography, which is communicated with the first through hole, thereby obtaining a structure shown in FIG. 8.

In 307, the sacrificial layer between the first electrode layer and the substrate is removed through the second through hole and the first through hole.

Herein, the sacrificial layer between the first electrode layer and the substrate is removed by an etching process through the second through hole and the first through hole.

It is to be noted that the sacrificial layer may be removed by wet etching or vapor etching through the first through hole and the second through hole, obtaining a structure shown in FIG. 2.

In addition, in the embodiment of the disclosure, if the dry film photoresist material is used for forming the first protective sublayer and the second protective sublayer, the durability of the protective layer may be further ensured.

According to the fabrication method for the acoustic wave device in the embodiment of the disclosure, when the acoustic wave device is being fabricated, the protective layer is formed at the first position above the surface, far away from the substrate, of the second electrode layer of the acoustic wave device. The protective layer may shelter and protect an "air bridge" structure formed at a resonance region of the acoustic wave device. In this way, the problem of influence of a fabrication process on the "air bridge" structure in the acoustic wave device during fabrication of the acoustic wave device is solved, and influence on the resonance region of the acoustic wave device is avoided, thereby improving the performance of the acoustic wave device.

Figure 9:
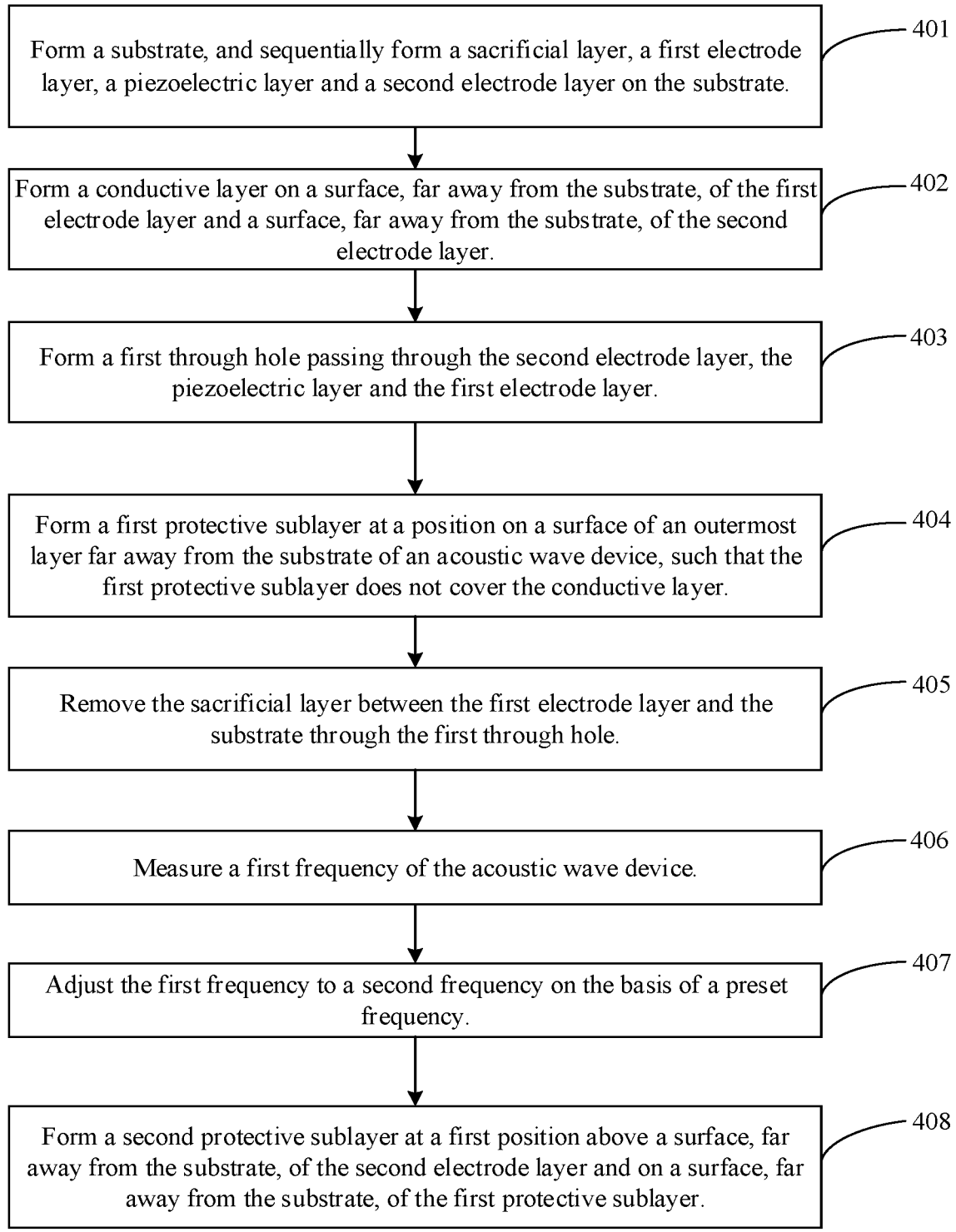
FIG. 9 is a flowchart of a fabrication method for an acoustic wave device according to still a further embodiment of the disclosure.

Based on the abovementioned embodiments, an embodiment of the disclosure provides a fabrication method for an acoustic wave device. Referring to FIG. 9, the method includes the following steps.

In 401, a substrate is formed, and a sacrificial layer, a first electrode layer, a piezoelectric layer and a second electrode layer are sequentially formed on the substrate.

In 402, a conductive layer is formed on the surface, far away from the substrate, of the first electrode layer and the surface, far away from the substrate, of the second electrode layer.

In 403, a first through hole passing through the second electrode layer, the piezoelectric layer and the first electrode layer is formed.

Herein, the first through hole, which passes through the piezoelectric layer, the first electrode layer and the second electrode layer and reaches up to substrate, is formed in the second electrode layer.

In 404, a first protective sublayer is formed at a position on a surface of an outermost layer far away from the substrate of the acoustic wave device, such that the first protective sublayer does not cover the conductive layer.

Figure 6:
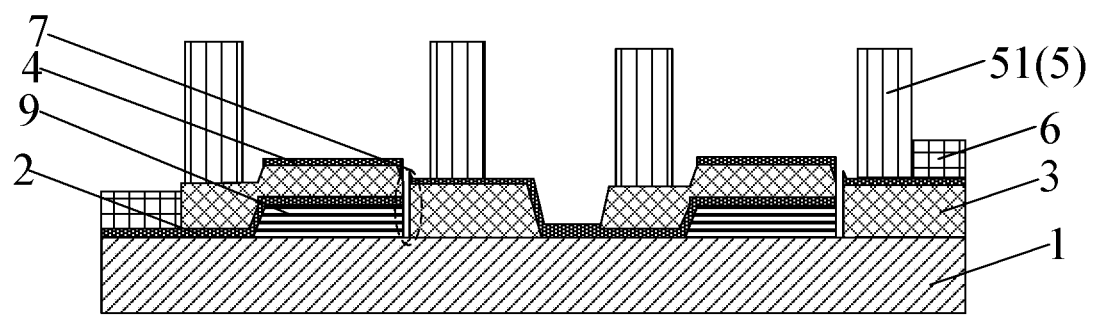
FIG. 6 is a structure diagram during a fabrication process of an acoustic wave device according to an embodiment of the disclosure.

After the first protective sublayer is formed, a structure shown in FIG. 6 may be obtained, in which the sacrificial layer 9 is visible.

In 405, the sacrificial layer between the first electrode layer and the substrate is removed through the first through hole.

Herein, the sacrificial layer between the first electrode layer and the substrate is removed by an etching process through the first through hole.

Figure 10:
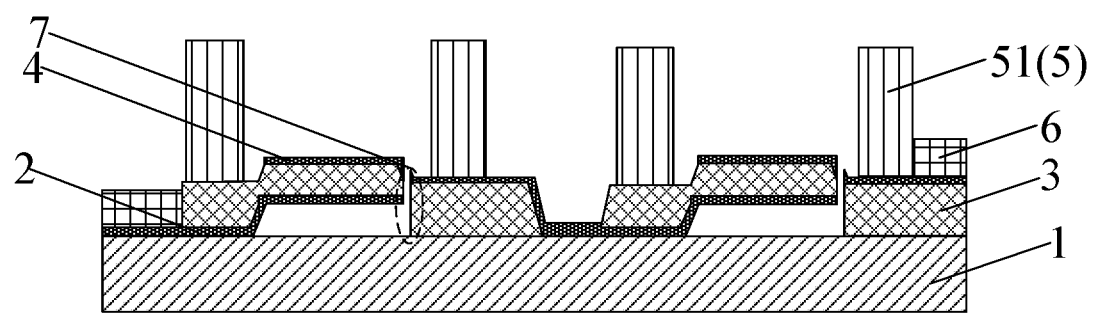
FIG. 10 is a structure diagram during a fabrication process of an acoustic wave device according to still a further embodiment of the disclosure.

It is to be noted that, in the embodiment of the disclosure, the sacrificial layer may be etched through the first through hole to obtain a structure shown in FIG. 10. In this case, the sacrificial layer in the structure has been removed by etching.

In 406, a first frequency of the acoustic wave device is measured.

In 407, the first frequency is adjusted into a second frequency on the basis of a preset frequency.

The second frequency is matched with the preset frequency.

Figure 11:
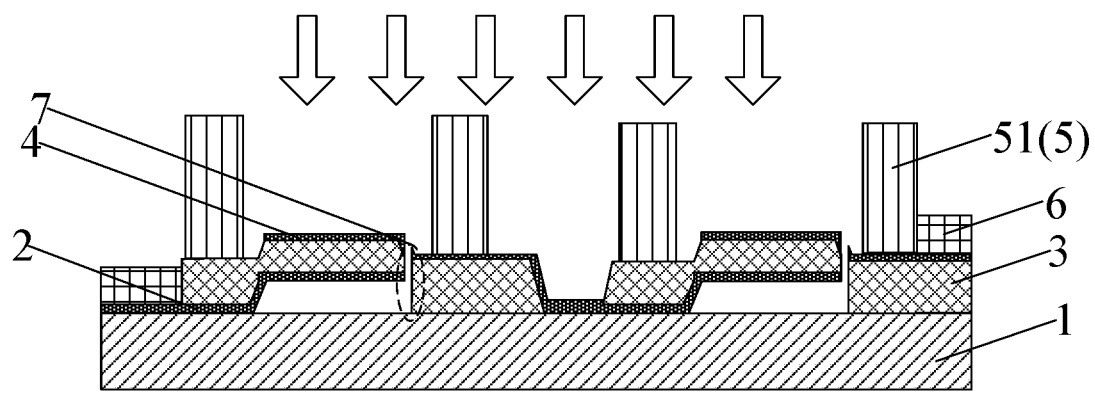
FIG. 11 is a structure diagram in a fabrication process of an acoustic wave device according to still a further embodiment of the disclosure.

It is to be noted that, in the embodiment, the formed sacrificial layer may be etched at first. In this case, the first electrode layer and the second electrode layer may not be interfered by other additional layers. Therefore, as shown in FIG. 11, after the sacrificial layer is etched, the frequency of the acoustic wave device may be checked and adjusted through ion beams or laser indicated by arrowheads in FIG. 11, thereby further ensuring accuracy of the frequency of the finally formed acoustic wave device and increasing percent of pass of products.

Moreover, the acoustic wave device is formed by stacking layers of thin films. A little thickness difference of each layer may cause an offset of 1-3 MHz in the frequency of the acoustic wave device. However, it is difficult to ensure the accuracy of thickness during fabrication of each layer of the acoustic wave device. Therefore, after the acoustic wave device is finished, it is necessary to measure a device frequency distribution of each region on a wafer, input a frequency result of the wafer into a detection device, and adjust the frequency of the wafer surface device according to the measured data from the detection device.

In 408, a second protective sublayer is formed at a first position above the surface, far away from the substrate, of the second electrode layer and on the surface, far away from the substrate, of the first protective sublayer.

The first position is a position, corresponding to a first overlapping region, above the second electrode layer. The first overlapping region, where an active area of the acoustic wave device is located, is at least a part of a region where the first electrode layer, the second electrode layer and the piezoelectric layer are overlapped.

Figure 12:
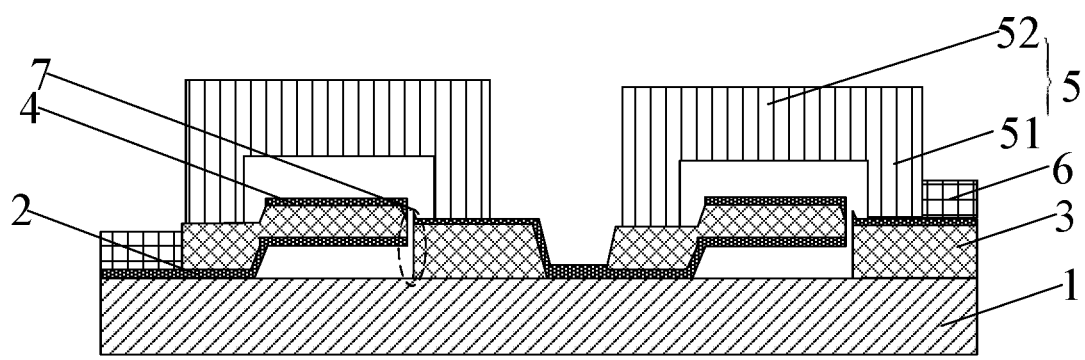
FIG. 12 is a structure diagram of an acoustic wave device according to an embodiment of the disclosure.

The first protective sublayer and the second protective sublayer are connected together, thereby forming a structure shown in FIG. 12.

According to the fabrication method for the acoustic wave device in the embodiment of the disclosure, when the acoustic wave device is being fabricated, a protective layer is formed at the first position above the surface, far away from the substrate, of the second electrode layer of the acoustic wave device. The protective layer may shelter and protect an "air bridge" structure formed at a resonance region of the acoustic wave device. In this way, the problem of influence of a fabrication process on the "air bridge" structure in the acoustic wave device during fabrication of the acoustic wave device is solved, and influence on the resonance region of the acoustic wave device is avoided, thereby improving the performance of the acoustic wave device.

The above is only the preferred embodiments of the disclosure and not intended to limit the scope of the disclosure.

The invention claimed is:

1. An acoustic wave device, comprising a substrate, as well as a first electrode layer, a piezoelectric layer and a second electrode layer which are sequentially arranged on the substrate, the acoustic wave device further comprising a protective layer,
   wherein the protective layer is at least arranged at a first position above a surface, away from the substrate, of the second electrode layer; and
   the first position is a position, corresponding to a first overlapping region, above the second electrode layer, and
   the first overlapping region, where an active area of the acoustic wave device is located, is at least a part of a region where the first electrode layer, the second electrode layer and the piezoelectric layer are overlapped,
   the acoustic wave device further comprising a conductive layer arranged on a surface, away from the substrate, of the first electrode layer and a surface, away from the substrate, of the second electrode layer,
   wherein the protective layer is arranged at a position such that the protective layer does not cover the conductive layer,
   wherein the protective layer comprises a first protective sublayer and a second protective sublayer;
   the first protective sublayer is arranged at a position on a surface of an outermost layer away from the substrate of the acoustic wave device, such that the first protective sublayer does not cover the conductive layer;
   the second protective sublayer is arranged at the first position above the surface, away from the substrate, of the second electrode layer;
   the second protective sublayer is also arranged on a surface, away from the substrate, of the first protective sublayer; and
   the first protective sublayer and the second protective sublayer are connected together,
   wherein a position of the first protective sublayer is at a preset distance from a position of the first overlapping region,
   wherein the preset distance is longer than 0.001 μm.

2. The acoustic wave device of claim 1, wherein a region between the protective layer and a portion, corresponding to the first overlapping region, of the second electrode layer is hollow.

3. The acoustic wave device of claim 1, wherein a region between the second protective sublayer and the second electrode layer is hollow.

4. The acoustic wave device of claim 1, wherein the acoustic wave device further comprises a first through hole passing through the second electrode layer, the piezoelectric layer and the first electrode layer and a second through hole passing through the second protective sublayer,
   wherein the second through hole is in fluid communication with the first through hole.

5. The acoustic wave device of claim 1, wherein a thickness of the first protective sublayer ranges from 0.001 μm to 200 μm; and
   a thickness of the second protective sublayer ranges from 1 μm to 200 μm.

6. A fabrication method for an acoustic wave device, comprising:
   forming a substrate, and sequentially forming a first electrode layer, a piezoelectric layer and a second electrode layer on the substrate; and
   forming a protective layer at least at a first position above a surface, away from the substrate, of the second electrode layer,
   wherein the first position is a position, corresponding to a first overlapping region, above the second electrode layer, and
   the first overlapping region, where an active area of the acoustic wave device is located, is at least a part of a region where the first electrode layer, the second electrode layer and the piezoelectric layer are overlapped,
   wherein the method further comprises:
   forming a conductive layer on a surface, away from the substrate, of the first electrode layer and a surface, away from the substrate, of the second electrode layer,
   wherein the protective layer is formed at a position such that the protective layer does not cover the conductive layer,
   wherein the protective layer comprises a first protective sublayer and a second protective sublayer, and
   wherein forming the protective layer comprises:
      forming the first protective sublayer at a position on a surface of an outermost layer away from the substrate of the acoustic wave device, such that the first protective sublayer does not cover the conductive layer; and
      forming the second protective sublayer at the first position above the surface, away from the substrate, of the second electrode layer and on a surface, away from the substrate, of the first protective sublayer,
      wherein the first protective sublayer and the second protective sublayer are connected together,
   wherein forming the substrate and sequentially forming the first electrode layer, the piezoelectric layer and the second electrode layer on the substrate comprises:
      forming the substrate, and sequentially forming a sacrificial layer, the first electrode layer, the piezoelectric layer and the second electrode layer on the substrate, after forming the substrate and sequentially forming the sacrificial layer, the first electrode layer, the piezoelectric layer and the second electrode layer on the substrate, the method further comprises:
forming a first through hole passing through the second electrode layer, the piezoelectric layer and the first electrode layer; and
correspondingly, after forming the second protective sublayer, the method further comprises:
forming a second through hole passing through the second protective sublayer and in communication with the first through hole, and
removing the sacrificial layer between the first electrode layer and the substrate through the second through hole and the first through hole.

7. A fabrication method for an acoustic wave device, comprising:
forming a substrate, and sequentially forming a first electrode layer, a piezoelectric layer and a second electrode layer on the substrate; and
forming a protective layer at least at a first position above a surface, away from the substrate, of the second electrode layer,
wherein the first position is a position, corresponding to a first overlapping region, above the second electrode layer, and
the first overlapping region, where an active area of the acoustic wave device is located, is at least a part of a region where the first electrode layer, the second electrode layer and the piezoelectric layer are overlapped,
wherein the method further comprises:
forming a conductive layer on a surface, away from the substrate, of the first electrode layer and a surface, away from the substrate, of the second electrode layer,
wherein the protective layer is formed at a position such that the protective layer does not cover the conductive layer,
wherein the protective layer comprises a first protective sublayer and a second protective sublayer, and wherein forming the protective layer comprises:
forming the first protective sublayer at a position on a surface of an outermost layer away from the substrate of the acoustic wave device, such that the first protective sublayer does not cover the conductive layer; and
forming the second protective sublayer at the first position above the surface, away from the substrate, of the second electrode layer and on a surface, away from the substrate, of the first protective sublayer,
wherein the first protective sublayer and the second protective sublayer are connected together,
wherein forming the substrate and sequentially forming the first electrode layer, the piezoelectric layer and the second electrode layer on the substrate comprises:
forming the substrate, and sequentially forming a sacrificial layer, the first electrode layer, the piezoelectric layer and the second electrode layer on the substrate,
after forming the substrate and sequentially forming the sacrificial layer, the first electrode layer, the piezoelectric layer and the second electrode layer on the substrate, the method further comprises:
forming the first through hole passing through the second electrode layer, the piezoelectric layer and the first electrode layer; and
correspondingly, before forming the second protective sublayer, the method further comprises:
removing the sacrificial layer between the first electrode layer and the substrate through the first through hole.

8. The method of claim 7, after removing the sacrificial layer between the first electrode layer and the substrate through the first through hole, the method further comprises:
measuring a first frequency of the acoustic wave device; and
adjusting the first frequency to a second frequency on the basis of a preset frequency, wherein the second frequency is matched with the preset frequency.

* * * * *